United States Patent
Telecky et al.

(10) Patent No.: US 12,498,641 B2
(45) Date of Patent: Dec. 16, 2025

(54) PROCESS ENVIRONMENT FOR INORGANIC RESIST PATTERNING

(71) Applicant: Inpria Corporation, Corvallis, OR (US)

(72) Inventors: Alan J. Telecky, Albany, OR (US); Jason K. Stowers, Corvallis, OR (US); Douglas A. Keszler, Corvallis, OR (US); Stephen T. Meyers, Corvallis, OR (US); Peter De Schepper, Wijnegem (BE); Sonia Castellanos Ortega, Leuven (BE); Michael Greer, Corvallis, OR (US); Kirsten Louthan, Philomath, OR (US)

(73) Assignees: Inpria Corporation, Corvallis, OR (US); Tokyo Electron Limited, Tokyo (JP)

( * ) Notice: Subject to any disclaimer, the term of this patent is extended or adjusted under 35 U.S.C. 154(b) by 24 days.

(21) Appl. No.: 18/596,255

(22) Filed: Mar. 5, 2024

(65) Prior Publication Data

US 2024/0272557 A1 Aug. 15, 2024

Related U.S. Application Data

(63) Continuation of application No. 17/188,679, filed on Mar. 1, 2021, now Pat. No. 11,947,262.
(Continued)

(51) Int. Cl.
*G03F 7/38* (2006.01)
*G03F 7/004* (2006.01)

(52) U.S. Cl.
CPC .............. *G03F 7/38* (2013.01); *G03F 7/0042* (2013.01)

(58) Field of Classification Search
CPC ............ G03F 7/38; G03F 7/0042; G03F 7/168
See application file for complete search history.

(56) References Cited

U.S. PATENT DOCUMENTS 5,700,629 A 12/1997 Kakumaru
8,822,129 B2 9/2014 Iwato et al.
(Continued)

FOREIGN PATENT DOCUMENTS

DE 3830131 A1 * 4/1989
JP 2013-080004 A 5/2013
(Continued)

OTHER PUBLICATIONS

Bas, Ed. Indoor air quality: A guide for facility managers. River Publishers, 2003. (Year: 2003).*
(Continued)

*Primary Examiner* — Mark F. Huff
*Assistant Examiner* — Moriah S. Smoot
(74) *Attorney, Agent, or Firm* — Christensen, Fonder, Dardi PLLC; Diane E. Bennett; Peter S. Dardi

(57) ABSTRACT

The processing of radiation patternable organometallic coatings is shown to be improved through the appropriate selection of post processing conditions between coating and development of the pattern. In particular, a coated wafer can be subjected to process delays to allow aging of the coating at various process points, in particular following irradiation. Process delays can be combined and interspersed with heating steps. The atmosphere above the coated wafer at various process steps can be adjusted to obtain desired improvements in the development of the pattern. Reactive gases can be beneficial with respect to improvement of coating properties.

30 Claims, 7 Drawing Sheets

Related U.S. Application Data

(60) Provisional application No. 62/984,023, filed on Mar. 2, 2020.

(56) References Cited

U.S. PATENT DOCUMENTS

| | | |
|---|---|---|
| 9,176,377 B2 | 11/2015 | Stowers et al. |
| 9,281,207 B2 | 3/2016 | Stowers et al. |
| 9,310,684 B2 | 4/2016 | Meyers et al. |
| 9,372,402 B2 | 6/2016 | Freedman et al. |
| 9,778,561 B2 | 10/2017 | Marks et al. |
| 9,996,004 B2 | 6/2018 | Smith et al. |
| 10,288,618 B2 | 5/2019 | Chacko et al. |
| 10,627,719 B2 | 4/2020 | Waller et al. |
| 2002/0076495 A1 | 6/2002 | Maloney et al. |
| 2002/0164539 A1 | 11/2002 | MacDowell et al. |
| 2005/0250054 A1 | 11/2005 | Chang |
| 2011/0244403 A1 | 10/2011 | Carcasi et al. |
| 2013/0224652 A1 | 8/2013 | Bass et al. |
| 2014/0212811 A1 | 7/2014 | Inoue et al. |
| 2015/0234272 A1 | 8/2015 | Sarma et al. |
| 2015/0323866 A1 | 11/2015 | Namai et al. |
| 2016/0011505 A1 | 1/2016 | Stowers et al. |
| 2016/0116839 A1 | 4/2016 | Meyers et al. |
| 2017/0102612 A1* | 4/2017 | Meyers ................ G03F 7/162 |
| 2017/0146909 A1 | 5/2017 | Smith et al. |
| 2018/0046086 A1 | 2/2018 | Waller et al. |
| 2018/0173096 A1 | 6/2018 | Zi et al. |
| 2018/0321589 A1 | 11/2018 | Tsuchimura et al. |
| 2019/0053001 A1 | 2/2019 | Tanabe et al. |
| 2019/0137870 A1 | 5/2019 | Meyers et al. |
| 2019/0308998 A1 | 10/2019 | Cardineau et al. |
| 2019/0315782 A1 | 10/2019 | Edson et al. |
| 2020/0124970 A1 | 4/2020 | Kocsis et al. |
| 2020/0326627 A1 | 10/2020 | Jiang et al. |
| 2021/0026241 A1 | 1/2021 | Cardineau et al. |

FOREIGN PATENT DOCUMENTS

| | | | |
|---|---|---|---|
| WO | 00-012231 A1 | 3/2000 | |
| WO | 2004-073036 A2 | 8/2004 | |
| WO | 2014-132992 A | 9/2014 | |
| WO | 2017-138267 A1 | 8/2017 | |
| WO | 2019-217749 A1 | 11/2019 | |
| WO | 2020-132281 A1 | 6/2020 | |
| WO | 2020-264571 A1 | 12/2020 | |
| WO | WO-2020264556 A1 * | 12/2020 | ........... G03F 7/0042 |
| WO | 2021-072042 A1 | 4/2021 | |

OTHER PUBLICATIONS

Alberts, W. Michael. "Indoor air pollution: No, No2, CO, and CO2." Journal of allergy and clinical immunology 94.2 (1994): 289-295. (Year: 1994).*

Flachsbart, Peter G. "Exposure to ambient and microenvironmental concentrations of carbon monoxide." Carbon monoxide poisoning. CRC Press, 2007. 31-68. (Year: 2007).*

English translaiton of DE 3830131 Apr. 20, 1989.*

Office Action from corresponding Japanese Patent Application No. 2022-552656 dated Sep. 17, 2024.

Azuma et al., "Effects of Low-level inhalation exposure to carbon dioxide in indoor environments: A short review on human health and psychomotor performance", Environment International, vol. 121, p. 51-56, (2018).

Chandrasekhar et al., "Organotin assemblies containing Sn—O bonds", Coord. Chem. Rev., vol. 235, p. 1-52, (2002).

Hotalen et al., "Advanced Development Techniques for Metal-Based EUV Resists", Proc. of SPIE vol. 10143 1014309-1, Mar. 6, 2020.

Kenane, "Chemistry of High-Resolution Organotin Patterning Materials", An Abstract of the Dissertation, (2020).

Pleasseraud et al., "Di-nbutyltin oxide as a chemical carbon dioxide capturer", J. Organometallic Chem., vol. 695, p. 1618-1626, (2010).

Pleasseraud et al., "Unprecedented Hexa- and Undecanuclear Frameworks of Two New Tin(IV) Oxo Clusters Resulting from Partial Debenzylation Reactions", Z. Naturforsch, vol. 65b, p. 1293-1300, (2010).

Pleasseraud et al., "A New Dodecanuclear Organostannoxane", Z. Naturforsch, vol. 66b, p. 262-268, (2011).

Thornton et al., "Surface Hydroxyl Groups and the Chemisorption of Carbon Dioxide and Carbon Monoxide on Tin (v) Oxide" Journal of the Chemical Society, Faraday Transactions 1: Physical Chemistry in Condensed Phases, p. 461-472, (1975).

Zheng et al., "A New System in Organooxotin Cluster Chemistry Incorporating Inorganic and Organic Spacers between Two Ladders Each Containing Five Tin Atoms", Chem. Eur. J., vol. 10, p. 3761-3768, (2010).

International Search Report for corresponding Patent Application No. PCT/US2021/020269 dated Jun. 17, 2021.

* cited by examiner

PROCESS ENVIRONMENT FOR INORGANIC RESIST PATTERNING

CROSS REFERENCE TO RELATED APPLICATIONS

This application is a continuation of the copending U.S. patent application Ser. No. 17/188,679 filed Mar. 1, 2021 to Telecky et al., entitled "Process Environment for Inorganic Resist Patterning," which claims priority to corresponding U.S. provisional patent application 62/984,023, filed Mar. 2, 2020 to Telecky et al., entitled "Process Environment For Inorganic Resist Patterning," incorporated herein by reference.

FIELD OF THE INVENTION

The invention related to the processing of radiation sensitive organometallic patterning compositions, in particular organo tin oxide hydroxide based compositions, with respect to the deposition through development of a pattern.

BACKGROUND OF THE INVENTION

Semiconductor manufacturing demands both high performance and high reproducibility of the materials and processes that comprise the fabrication of semiconductor devices. During high-volume manufacturing, for example, it is desirable for a lithography process to yield features of identical size and shape in a repeatable fashion across many wafers and across many days and it is therefore desirable that the patterning stability of lithographic materials is high.

Metal oxide hydroxide photoresists, in particular organotin oxide materials, are promising materials for semiconductor patterning and manufacturing due to their high absorbance, high pattern fidelity, and high etch contrast. Despite these advantages, it is known that many of these materials are susceptible to environmental effects such as humidity or composition of atmospheres the wafer is exposed to throughout the multi-step manufacturing process. The current invention can reduce variation in processing of and/or improve the sensitivity of metal oxide hydroxide photoresists.

SUMMARY OF THE INVENTION

The methods described herein improve the process variability of metal oxide hydroxide photoresists by way of processing the photoresists in the presence of controlled concentrations of reactive gases throughout wafer processing. The invention further pertains to exposing the radiation patterned metal oxide hydroxide photoresist coating to an atmosphere with controlled and/or targeted concentrations of reactive gases, for example carbon dioxide, carbon monoxide, and water. The reactive gases can be introduced during typical processing, or they can be introduced at selected temperatures.

The invention further pertains to exposing the radiation patterned metal oxide hydroxide coating to a chemical capable of reacting with the exposed material to convert at least a portion of either the irradiated or unirradiated material to a new composition.

In particular, the invention pertains to a method for improving the processing of radiation patternable organo tin-based coatings on a wafer having a thickness from about 1 nm to about 500 nm, the method comprising, following irradiation, the step of storing the wafer with the coating to age prior to pattern development in an atmosphere at a pressure of at least about 200 Torr, wherein aging is for at least about 20 minutes.

In further embodiments, the invention pertains to a method for forming a radiation patternable organo tin-based coating on a wafer having an average thickness from about 1 nm to about 500 nm, the method comprising the step of contacting the wafer with the coating with an atmosphere comprising a $CO_2$ concentration from about 500 ppm to about 10 mole percent prior to development to form a physical pattern, the coating comprising a composition represented by the formula $RSnO_xOH_{3-x}$ wherein R is an organic ligand with 1-31 carbon atoms, with a carbon atom bonded to Sn and with one or more carbon atoms optionally substituted with one or more heteroatom functional groups.

In additional embodiments, the invention pertains to a method for improving the processing of a radiation patternable organo tin-based coating comprising organo tin oxide hydroxide having Sn—C bonds, wherein the coating has a thickness from about 1 nm to about 500 nm, the method comprising the step of contacting the wafer with the organo tin oxide hydroxide coating, following irradiation, to an atmosphere comprising a reactive gas to alter the tin-bound ligands in the irradiated regions, wherein the reactive gas comprises $SO_2$, $H_2S$, $CH_3SH$, CO, COS, HOOH, $NH_3$, $H_2$, $O_3$, nitrogen oxide, $PH_3$, $SiH_4$, $CH_4$, ethylene oxide or a combination thereof.

In other embodiments, the method pertains to a method for improving the processing of radiation patternable organo tin-based coatings comprising organo tin oxide hydroxide having Sn—C bonds, wherein the coating has a thickness from about 1 nm to about 500 nm on a wafer, the method comprising the step of contacting the organo tin oxide hydroxide coating with an atmosphere comprising a reactive gas, wherein the reactive gas comprises $SO_2$, $H_2S$, $CH_3SH$, CO, COS, $H_2$, $O_3$, nitrogen oxide, $PH_3$, $SiH_4$, HOOH, $NH_3$, $CH_4$, or ethylene oxide and wherein the reactive gas differentially alters the tin-bound ligands in the irradiated and non-irradiated portions of the coating such that a latent image formed by exposure to radiation results in a greater contrast in development rate between the irradiated and non-irradiated portions of the coating. In some embodiments, the increase in contrast can result in an increase in critical dimension in a developed structure of at least about 0.25 nm.

DETAILED DESCRIPTION OF THE INVENTION

Figure 1:
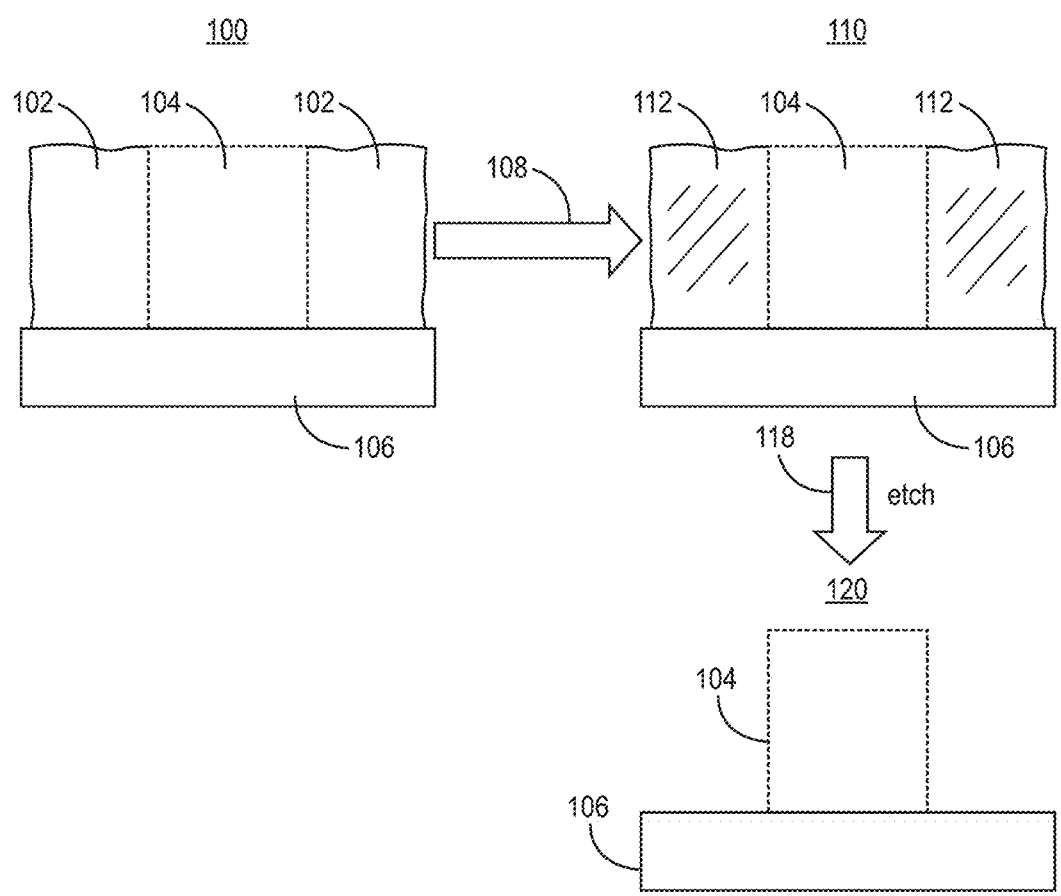
FIG. 1 is a schematic of a process flow in which a resist is contacted with a controlled atmosphere during processing and ultimately developed.

The patterning of organo tin-based resists can be improved through the post coating processing of an as deposited coating leading up to development of the image formed through irradiation. By controlling the partial pressures of reactive gases that a wafer coated with a metal oxide hydroxide is exposed to during processing, material variability and subsequent patterning variability can be reduced. Additionally or alternatively, aging of the wafers following irradiation can further a condensation or network forming process of the irradiated material to improve pattering contrast, and the atmosphere during aging can also be adjusted to improve the processing. Part of the improved processing can include aging of post-irradiated wafers prior to development, and some desirable aging can be performed with an inert atmosphere. In particular, in some embodiments, the current description covers methods of exposing a metal oxide hydroxide photoresist to specific concentrations of reactive gases. Furthermore, upon exposure of the radiation patterned metal oxide hydroxide material with particular reactive gases, the patterned material can react to and at least partially convert into a new composition. Alternatively or additionally, the unirradiated portion of the metal oxide hydroxide coating can react with a reactive gas to at least partially convert to a new composition. In some embodiments, a resultant new composition of this modified material can show, among other differences, improved etch selectivity, hardness, stress, and stability relative to the non-modified composition. Additionally, or alternatively, exposure of the radiation patterned metal oxide hydroxide photoresist material to a reactive gas can alter the surface of the material to result in a significantly altered polarity or surface energy difference relative to the initial material surface and therefore can result in a markedly different etch selectivity or adhesion.

Wafer processing generally includes all of the individual processes that the substrate or wafer undergoes from coating/deposition to removal from the substrate. Additionally, tone-reversal processes may be implemented to invert the tone photoresist pattern. In general, wafer processes can include coating, baking, transfer steps, backside and edge-bead rinsing, radiation exposure, development, annealing, and etch. It has been discovered that it is desirable to control the presence and concentrations of reactive gases during wafer processing as well as controlling the timing of processing.

When exposed with appropriate gases or other reactive species, inorganic materials, metal oxides, and metal hydroxides can react to form new compounds that exhibit properties and/or compositions different than the starting material. This is depicted schematically in FIG. 1. Irradiated structure 100 comprises irradiated coating material 102, un-irradiated coating material 104 on substrate 106. Following post irradiation processing 108, treated structure 110 comprises transformed material 112 adjacent un-irradiated coating material 104 on substrate 106. Following etching 118, etched structure 120 has treated coating material removed.

For example, many metal oxides can be exposed to hydrogen gas to drive a reduction reaction to convert the metal into a lower oxidation state or to its elemental form. In addition, many metals possess multiple stable oxidation states, e.g. $Fe^{2+}/Fe^{3+}$, $Sn^{2+}/Sn^{4+}$, $Sb^{3+}/Sb^{5+}$, etc., and their corresponding oxides can exhibit different physical and chemical properties such as conductivity, solubility, hardness, and density. In some cases, only a portion of the patterned metal oxide material is converted into a new composition. Ultimately these different properties can then enable subsequent etch processes, including development processes that could not otherwise be achieved.

The current processing can be based on the presence of non-volatile metal ions within the metal oxide hydroxide coating material. In contrast to conventional polymer patterning materials, materials that comprise metal ions, such as metal oxide hydroxide materials, can undergo chemical changes related to oxidation state and/or ligand structure when exposed to and reacted with specific reactive compositions, such as gases, liquids, or plasmas. Many metals possess multiple stable oxidation states that can be selectively formed by controlling appropriate reaction conditions. Furthermore, metal oxides and hydroxides are also known to incorporate various anions and counterions into their structures to form a new composition with different properties than the beginning material. Organometallic compositions such organotin oxide hydroxides and organoantimony oxide hydroxides also possess this ability to incorporate counterions due to their metal oxide hydroxide character, e.g. the presence of metal-oxygen and metal-hydroxide bonds.

Empirical evaluation of the resulting coating material properties generally can be performed to select processing conditions that are effective for the patterning process. While heating may not be needed for successful application of the process, it can be desirable to heat the coated substrate to speed the processing and/or to increase the reproducibility of the process and/or to facilitate vaporization of volatile byproducts. In embodiments in which heat is applied to remove solvent in a pre-exposure bake, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. Final film thickness is determined by baking temperatures and times as well as the initial concentration of the precursor. A person of ordinary skill in the art will recognize that additional ranges of heating temperature and times within the explicit ranges above are contemplated and are within the present disclosure. As a result of the heat treatment, potential hydrolysis, and densification of the coating material, the coating material can exhibit an increase in index of refraction and in absorption of radiation without significant loss of dissolution rate contrast.

The deposition process determines the wet coating thickness. For further processing, the solvent is generally removed to leave a solid layer as a coating on the substrate. For appropriate embodiments, the solution concentration and process conditions influence the dry coating thickness, which can be selected to achieve desired patterning properties. Similarly, for a vapor coating process, the vapor deposition parameters, such as deposition rates and times can influence the coating thickness. The average dry coating thickness can be from about 1 nm to about 1000 nm, in some embodiments from about 2 nm to about 300 nm, in further embodiments from about 3 nm to about 200 nm and in additional embodiments from about 3 nm to about 80 nm. For vapor deposition described below, the coating thickness can be correspondingly adjusted through process conditions to achieve a desired layer thickness for the coating. A person of ordinary skill in the art will recognize that additional average thickness ranges within the explicit ranges above are contemplated and are within the present disclosure.

Water vapor, for example, can react with metal oxides and hydroxides to form metal hydroxides that can in turn undergo further condensation polymerization reactions according to reaction. As the reactions proceed, the resulting metal oxide hydroxide material can form a network via hydrogen bonding or condense by elimination of water to form materials with decreased development rates. Therefore, it is possible to decrease the dose needed to pattern a metal oxide hydroxide photoresist to yield a desired feature size by exposing the photoresist to water vapor. In particular, exposing the radiation patterned material to water vapor may improve the sensitivity of the photoresist.

The water content of air is typically expressed in terms of percent relative humidity (RH %) because the equilibrium vapor pressure of water varies directly with temperature. For a given temperature, a higher RH % indicates that more water vapor is present in the air than for a lower RH % value. To reduce process variability, each step in the processing of the substrate from coating to post-development annealing can be performed in an environment with constant relative humidity, generally between 40% and 60%. In other embodiments, a selected RH % may vary for different steps throughout lithographic processing; however, within each step it may generally be desirable for the RH % to be roughly constant. In general, the relative humidity (RH) is set for a wafer patterning facility is set between 40% and 60% and is maintained close to these values. The RH in the atmosphere around the wafer during processing, such as in a coating module or in a baking module within a wafer track, can be set to values different from the greater facility. In some embodiments, the RH in a processing atmosphere can be higher than the greater facility, such as between 60% and 80%, between 80% and 90% in other embodiments, and above 90% in further embodiments. In other embodiments, the RH in a processing atmosphere can be lower than the greater facility, such as between 20% and 40%, between 10% and 20% in other embodiments, and lower than 10% in further embodiments. In some embodiments, the RH % of the processing atmospheres can vary no more than about 10%, in additional embodiments no more than about 5%, and no more than about 2% in further embodiments. The relative humidity and temperature correlates with a partial pressure for water vapor, and a person of ordinary skill in the art can interconvert these values. If an inert atmosphere is used for processing, such as nitrogen or argon, the water concentration can be very low, such as no more than 10 ppm by mole, with a corresponding RH value depending on temperature. A person of ordinary skill in the art will recognize that additional ranges of relative humidity and variations of relative humidity within the explicit ranges above ate contemplated and are within the present disclosure.

Furthermore, in some embodiments, it can be desirable to have an inert atmosphere over the coated wafer during at least part of the processing. For example, nitrogen ($N_2$), Ar, other inert gases or a combination thereof can be used. The pressure can be separately adjusted, but use of a pressure near atmospheric can involve simpler equipment with a flow venting to atmosphere. Alternatively, pressure regulated chambers are readily available for wafer processing using commercial equipment. Suitable pressure ranges are described further below. Examples are presented below with processing using $N_2$ during irradiation at 254 nm UV or during a post irradiation delay, which improved processing results obtained. Inert gases do not have to be perfectly pure to be effective, and it is generally desirable to be at least 95% by mole pure, in further embodiments at least about 98% by mole, in additional embodiments at least about 99% pure, and in other embodiments at least about 99.9% by mole pure. A person of ordinary skill in the art will recognize additional ranges within the explicit ranges above are contemplated and are within the present disclosure.

The general process flow is shown schematically in FIG. 1. First, a wafer is coated with a radiation patternable organometallic oxide hydroxide resist. The coated wafer is then dried, which can involve a post application bake (PAB). While heating may not be needed for successful application of the process, it can be desirable to heat the coated substrate to speed the processing and/or to increase the reproducibility of the process and/or to facilitate vaporization of the hydrolysis by products, such as amines and/or alcohols. In embodiments in which heat is applied to remove solvent, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. As a result of the heat treatment, hydrolysis, and densification of the coating material, the coating material can exhibit an increase in index of refraction and in absorption of radiation without significant loss of contrast.

The coated wafer after drying and applying any PAB can be stored for some time prior to irradiation. A particular process track can have a standard amount of time to move a coated wafer into position for exposure to radiation. A post coating delay can be introduced to further age the dry coated wafer prior to radiation exposure for a period of time greater than the usual process time to transfer a wafer to an exposure station of a process track. A post coating delay can be at least 20 minutes, in further embodiments at least about an hour, in further embodiments at least about 13 hours and in some embodiment from about 2 hours to about 7 days. A person of ordinary skill in the art will recognize that additional ranges within the explicit ranges above are contemplated and are within the present disclosure. A post coating delay (PCD) can be performed with a specified atmosphere over the wafer, such as air, air with a modified gas content, $N_2$, argon or other inert gas, or vacuum.

Figure 2:
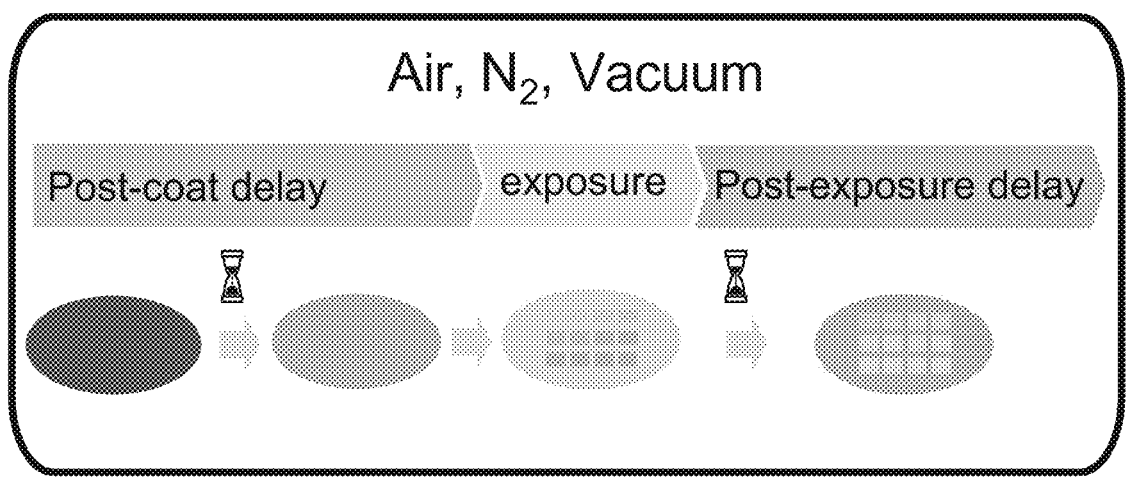
FIG. 2 is a schematic depiction showing the different phase of processing where the atmosphere in contact with the wafer can be selected.

Referring to FIG. 2, after any post coating delay, the structure is subjected to radiation exposure. To form a latent image in the organometallic resists, patterned radiation is directed to the radiation sensitive coating. Radiation generally can be directed to the coated substrate through a mask or a radiation beam can be controllably scanned across the substrate. In general, the radiation can comprise electromagnetic radiation, an electron beam (beta radiation), or other suitable radiation. In general, electromagnetic radiation can have a desired wavelength or range of wavelengths, such as visible, ultraviolet, extreme ultraviolet, or X-ray radiation. The resolution achievable for the radiation pattern is generally dependent on the radiation wavelength, and a higher resolution pattern generally can be achieved with shorter wavelength radiation. Thus, it can be desirable to use ultraviolet, extreme ultraviolet, or X-ray radiation, or electron-beam irradiation to achieve particularly high-resolution patterns.

Following International Standard ISO 21348 (2007) incorporated herein by reference, ultraviolet light extends between wavelengths of longer than or equal 100 nm and shorter than 400 nm. A krypton fluoride laser can be used as a source for 248 nm ultraviolet light. The ultraviolet range can be subdivided in several ways under accepted Standards, such as extreme ultraviolet (EUV) from longer than or equal 10 nm to shorter than 121 nm and far ultraviolet (FUV) from longer than or equal to 122 nm to shorter than 200 nm. A 193 nm line from an argon fluoride laser can be used as a radiation source in the FUV. EUV light at 13.5 nm has been used for lithography, and this light is generated from a Xe or Sn plasma source excited using high energy lasers or discharge pulses. Soft X-rays can be defined from longer than or equal 0.1 nm to shorter than 10 nm.

The amount of electromagnetic radiation can be characterized by a fluence or dose, which is defined by the integrated radiative flux over the exposure time. Generally, suitable EUV radiation fluences can be from about 1 $mJ/cm^2$ to about 175 $mJ/cm^2$, in further embodiments from about 2 $mJ/cm^2$ to about 150 $mJ/cm^2$, and in further embodiments from about 3 $mJ/cm^2$ to about 125 $mJ/cm^2$. A person of ordinary skill in the art will recognize that additional ranges of radiation fluences within the explicit ranges above are contemplated and are within the present disclosure.

Based on the design of the coating material, a large contrast of material properties can be induced between the irradiated and unirradiated regions of the coating material. Following irradiation, the irradiated structure can be subjected to post exposure processing prior to development of the latent image, see FIG. 2. In particular, post exposure processing can involve a post exposure bake and/or a post exposure delay to age the irradiated structure. For embodiments in which a post irradiation heat treatment is used (post exposure bake (PEB)), the post-irradiation heat treatment can be performed prior to development at temperatures from about 45° C. to about 250° C., in additional embodiments from about 50° C. to about 225° C., in further embodiments from about 60° C. to about 200° C. and in other embodiments from about 95° C. to about 190° C., as well as explicitly including any ranges based on a combination of lower limits with the upper limits, such as from about 95° C. to about 250° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. A post exposure bake (PEB) can be performed with a specified atmosphere over the wafer, such as air, air with a modified gas content, $N_2$, argon or other inert gas, or vacuum, as described herein. This high contrast in material properties further facilitates the formation of high-resolution lines with smooth edges in the pattern following development as described in the following section.

Also, it can be desirable to have a post exposure delay in which the exposed wafer is aged. A post exposure delay can be used as an alternative to a post exposure bake (although neither may be used in some embodiments), or a post exposure delay can be performed prior to a post exposure bake, or a post exposure delay can be performed after a post exposure bake, or a post exposure bake can be performed both after a first post exposure delay and before a second a post exposure bake. If heating is performed during a post exposure delay, the heating temperature is generally lower than the temperature of a post exposure bake, and an appropriate temperature ramp would be used to transition between the different heating domains.

A post exposure delay can be for a time of at least about 10 minutes, in further embodiments at least about 20 minutes, in additional embodiments from about 25 minutes to about 7 days, in some embodiments from about 30 minutes to about 3 days, and in other embodiments from about 40 minutes to about 2 days, and additional ranges explicitly include any and all combinations of the delay end points of these ranges. A post exposure delay (PED) can be performed with a specified atmosphere over the wafer, such as air, air with a modified gas content, $N_2$, argon or other inert gas, or vacuum, as described herein. A post exposure delay can be performed at ambient temperature or at an elevated temperature, which may accelerate process times to allow for a shorter delay. The temperature during a post exposure delay or a selected portion of the post exposure delay can be from about 30° C. to about 150° C., in additional embodiments from about 40° C. to about 130° C., in further embodiments from about 50° C. to about 120° C., and in some embodiments from about 55° C. to about 95° C., as well as explicitly including additional ranges based on these temperature end points such as from 30° C. to 95° C. A person of ordinary skill in the art will recognize that additional ranges of time and temperature within the explicit ranges above are contemplated and are within the present disclosure. Higher temperatures generally are not maintained for long periods of time. But the various process parameters can be optimized based on the teachings herein to obtain desirable improvements in the patterning.

Exposure to radiation for the organometallic resist compositions generally involves bond cleavage. In resist compositions of particular interest, bond cleavage generally involves breaking of carbon-metal bonds. The breaking of carbon metal bonds can leave reactive species, such as radicals and/or metal atoms with ability to form another ligand-metal bond. The organic species generally form gaseous by-products that exit the material, and the metal oxide hydroxide condenses toward a more metal oxide-like structure and/or forms a network of tightly bonded species to densify such that the patterned structure has a high etch contrast between the irradiated and non-irradiated regions.

For example, the densified irradiated coating becomes more insoluble in organic solvents used to solubilize the original organometallic composition.

Post exposure processing is generally directed to facilitating and enhancing the network formation and densification of the exposed coating. Heating generally can accelerate solid state reorganizations of lattice structures, which generally is part of the densification process, and heating can also facilitate certain reactions. Excessive heating though can have effects on the non-irradiated portions of the coating that could decrease development contrast, so heating should be controlled appropriately. Further aging through a post exposure delay prior to development of the latent image can provide further time for the densification process to occur. During post coating processing, the atmosphere surrounding the coated wafer can significantly influence the effects of the processing. The atmosphere can be characterized by composition and pressure.

A densification process involves a small volume change, so an increase in pressure would tend to thermodynamically favor densification. The converse generally is also true, such that lowering the pressure would tend to thermodynamically disfavor densification. Examples are presented below in which a vacuum applied during a post exposure delay is shown to result in a decrease in etch contrast. Similarly, the chemical nature of the atmosphere can alter the effects of port exposure processing. Again, suitable gaseous atmospheres include, for example, air, air plus additional gases, nitrogen, argon and other inert gases, and reactive gases. Some heat can be applied during a post exposure delay separate from or along with a separate post exposure bake, which may be a higher temperature than heating during the post exposure delay, such that the two process regimes are distinguished.

In particular, it has also been discovered that exposure of the radiation patterned material to carbon dioxide can increase the sensitivity of the photoresist. Formation of new compositions resulting from of $CO_2$ incorporation within organotin oxide hydroxide systems are shown in, for example, Plasseraud et al., J. Organometallic Chem. 2010, Vol 695, 1618-1626, entitled "Di-n-butyltin oxide as a chemical carbon dioxide capturer", Plasseraud et al. Z. Naturforsch. 2010, Vol. 65b, 1293-1300, entitled "Unprecedented Hexa- and Undecanuclear Frameworks of Two New Tin(IV) Oxo Clusters Resulting from Partial Debenzylation Reactions", and Zheng et al., Chem. Eur. J 2010, Vol. 10, 3761-3768, entitled "A New System in Organooxotin Cluster Chemistry Incorporating Inorganic and Organic Spacers between Two Ladders Each Containing Five Tin Atoms", all of which are incorporated herein by reference. While not wanting to be limited by theory, the increased sensitivity may occur because of the formation of metal carbonates that possess different solubility in developer solution than the carbonate-deficient or carbonate-free material. For example, it is known that metal carbonates and bicarbonates can form via the following reactions:

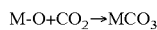
$$M\text{-}O + CO_2 \rightarrow MCO_3$$

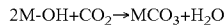
$$2M\text{-}OH + CO_2 \rightarrow MCO_3 + H_2O$$

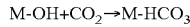
$$M\text{-}OH + CO_2 \rightarrow M\text{-}HCO_3$$

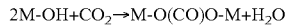
$$2M\text{-}OH + CO_2 \rightarrow M\text{-}O(CO)O\text{-}M + H_2O$$

Based on the teachings herein, the exposure to $CO_2$ can take place during one or more process steps between coating deposition and image development, and heat may or may not be applied during the exposure to $CO_2$.

The resulting metal carbonate material's solubility in a developer solution is diminished relative to the virgin material. This, in turn, translates into a lower dose that is required to pattern the photoresist to a desired feature size. Carbon dioxide is present in air, and the temporal changes in $CO_2$ in air are commonly discussed in the media these days. Currently, the amount of $CO_2$ in air is reported to be about 415 ppm. For the processing of wafers, air can be enhanced with increased partial pressures (concentrations) of $CO_2$ to favor carbonate formation. Also, Le Chatelier's Principle suggests that lowering the humidity also favors carbonate formation, although some humidity is desirable for the formation of metal hydroxides that can enable some carbonate formation pathways. Examples are presented below with 500 ppm $CO_2$ concentrations. In general, enhanced $CO_2$ levels can be at least about 450 ppm by mole, in some embodiments from about 475 ppm to about 10 mole percent, in further embodiments from 500 ppm to about 5 mole percent, and in additional embodiments from about 750 ppm by mole to about 1 mole percent, as well as explicit ranges with any of the lower limits combined with any of the upper limits. In some embodiments, $CO_2$ concentration can vary by no more than about 20%, in additional embodiments no more than about 10%, and no more than about 5% in further embodiments. A person of ordinary skill in the art will recognize that additional ranges of carbon dioxide concentration within the explicit ranges above are contemplated and are within the present disclosure.

The above examples with water vapor and carbon dioxide are meant to be illustrative, and not limiting. The current invention pertains to exposing the radiation patterned material with a reactive gas species to form a new non-volatile composition. Other reactive gases are anticipated and envisioned, such as oxygen ($O_2$), hydrogen peroxide ($H_2O_2$), ozone ($O_3$), sulfur dioxide, hydrogen sulfide (HS), carbon monoxide (CO), hydrogen gas ($H_2$), nitrogen oxide (for example, NO, $N_2O_2$, $NO_2$, $N_2O_4$, and $N_2O$), methane ($CH_4$), ammonia ($NH_3$), ethylene oxide (oxirane, cyclic-$C_2H_4O$), carbonyl sulfide (OCS), alkyl mercaptans ($CH_3SH$), silane or disilane ($SiH_4$, $Si_2H_6$), and phosphine ($PH_3$). For processing these compositions can be diluted with a carrier gas, such as air, dry air, nitrogen, argon or other inert gas. The overall pressures can fall within the explicit ranges above given for the general processing, such as at least about 200 Torr, or from 600 Torr to 800 Torr, although the other pressure ranges herein can be similarly used. With respect to the concentrations of these reactive gases in a carrier gas, if used, can be from about 100 ppm by mole to about 10 mole percent, in further embodiments form about 500 ppm to about 5 mole percent, and in other embodiments form about 0.1 mole percent to about 1 mole percent. A person of ordinary skill in the art will recognize that additional ranges of pressure and concentration within these explicit ranges are contemplated and are within the present disclosure. Examples of organotin oxide hydroxide systems comprising other anions have been described in Plasseraud et al., Z. Naturforsh. 2011, Vol. 66b, 262-268, entitled "A New Dodecanuclear Organostannoxane" and in a review by Chandrasekhar et al., Coord. Chem. Rev. 2002, Vol. 235, 1-52, entitled "Organotin assemblies containing Sn—O bonds", both of which are incorporated herein by reference. The synthesis work based on alkyl stannoic acid does not suggest the methods described herein or the specific ranges of compositions herein.

It is also not necessary for the same gases to be present at every point of processing. It may be desirable to have one reactive gas to be present during one process, while absent during another. Absolute concentrations of reactive gases needed for optimal results can be discovered through routine experimentation. Furthermore, absolute concentrations of reactive gases can vary for different processes within the photoresist's lifetime of processing. For example, the absolute concentration of $CO_2$ or water vapor that provides optimal results can be different between the coating process and a baking process for the same coating. Optimal results are also subjective with respect to the requirements for the formation of the desired integrated devices. Additionally, supercritical and hydrothermal conditions during one or more processing steps are envisioned and anticipated by the current invention.

The gas exposed to the wafer surface can be selected at specific process points. For EUV exposure and electron beam exposure, a vacuum is generally used for the irradiation chamber. Vacuum can be considered pressures below $1 \times 10^{-5}$ Torr, and for certain gas components even lower partial pressures may be desired. For UV processing, such as at 254 nm, a gas atmosphere that is not absorbing can be used, and examples are presented with air or nitrogen atmospheres during irradiation. The gaseous atmosphere over the wafer can be adjusted during other process steps, pre-irradiation bake, re-irradiation delay, post-irradiation bake and post irradiation delay, which take place prior to development.

Regardless of the chemical composition of the atmosphere over the wafer at various process points, the pressure can be correspondingly adjusted. The atmospheric pressure at the process facility can serve as a baseline. Since most facilities are above sea level, the actual average atmospheric pressure is less than a standard atmospheric pressure, and weather induced further temporal changes. Also, ventilation systems can be set to maintain a slight negative pressure relative to the outside pressure to control relative flow of gases into or out from the facility. Within a process chamber, a slight overpressure can be maintained to turn over the gases in the chamber. A person of ordinary skill in the art will recognizes these pressure issues, and from a practical perspective, pressures from about 600 Torr to about 800 Torr can be considered atmospheric pressure, and in some embodiments pressures from 800 Torr to 1200 Torr can be of interest with respect to maintaining a positive pressure flow of an atmosphere in contact with a wafer. Other pressure ranges can be useful for processing. Another range of potential interest includes pressure of at least about 200 Torr, and for the processing of wafers vacuum or low pressure can be considered any pressure of no more than about 1 Torr. A person of ordinary skill in the art will recognize that additional pressure ranges within the explicit ranges above are contemplated and are within the present disclosure.

Air can generally be provided by adjusting the temperature and relative humidity as well as adding any additional gases, such as reactive gases. Thus, air can be used as a carrier gas for reactive gases. Similarly, dry air can be used as a carrier gas to control that reactive gas content, and dry air can be considered as having no more than about 0.1 mole % water. The external pressure of the atmosphere can vary according to the elevation and the weather. A fabrication facility can maintain the pressure within a desired range using ventilation equipment, which can also adjust the relative humidity and the partial pressure of any further gases. Apart from water, a gaseous atmosphere can be considered modified air if the composition of the gas varied by no more than 10% relative to air. Especially at elevated temperatures that can be used during bake steps, water vapor can make up a significant fraction of a gas. Water vapor generally can be adjusted to have a desired relative humidity. Desirable ranges for carbon dioxide and other reactive gases are presented below.

Metal oxide hydroxide photoresists, such as organotin photoresists, have been shown to possess excellent properties as photoresists for use in lithographic photopatterning. Example metal oxide hydroxide photoresists include hafnium and zirconium oxide hydroxides that have been described in U.S. Pat. No. 9,176,377B2, entitled "Patterned Inorganic Layers, Radiation Based Patterning Compositions And Corresponding Methods" by Stowers et al. and in U.S. Pat. No. 9,281,207B2, entitled "Solution Processible Hardmasks for High Resolution Lithography" by Stowers et al, both of which are incorporated herein by reference. Organotin oxide photoresists, in particular, have been shown to achieve high resolution and high sensitivity. Preferable organotin oxide hydroxide photoresists include organotin materials as described in U.S. Pat. No. 9,310,684B2 to Meyers et al. (the '684 patent), entitled "Organometallic Solution Based High Resolution Patterning Compositions," published U.S. patent application 2016/0116839A1 to Meyers et al., entitled "Organometallic Solution Based High Resolution Patterning Compositions and Corresponding Methods," and U.S. Pat. No. 10,228,618B2 entitled "Organotin Oxide Hydroxide Patterning Compositions, Precursors, and Patterning", all of which are incorporated herein by reference. In particular, organometallic radiation sensitive resists have been developed based on alkyl tin compositions, such as alkyltin oxide hydroxide, approximately represented by the formula $R_zSnO_{(2-z/2-x/2)}(OH)_x$, where $0<x<3$, $0<z\leq2$, $x+z\leq4$, and R is a hydrocarbyl or organo group forming a carbon bond with the tin atom. Particularly effective forms of these compositions are monoalkytin oxide hydroxide, in which $z=1$ in the above formula.

In particular, R can be a moiety with 1-31 carbon atoms with one or more carbon atoms optionally substituted with one of more heteroatom functional groups, such as groups containing O, N, Si, Ge, Sn, Te, and/or halogen atoms, or an alkyl, or a cycloalkyl further functionalized with a phenyl, or cyano group. In some embodiments, R can comprise ≤10 carbon atoms and can be, for example, methyl, ethyl, propyl, isopropyl, butyl, t-butyl, isobutyl, or t-amyl. The R group can be a linear, branched, (i.e., secondary or tertiary at the metal-bonded carbon atom), or cyclic hydrocarbyl group. Each R group individually and generally has from 1 to 31 carbon atoms with 3 to 31 carbon atoms for the group with a secondary-bonded carbon atom and 4 to 31 carbon atoms for the group with a tertiary-bonded carbon atom. In particular, branched alkyl ligands can be desirable for some patterning compositions where the compound can be represented as $R^1R^2R^3CSn(NR')_3$, where $R^1$ and $R^2$ are independently an alkyl group with 1-10 carbon atoms, and $R^3$ is hydrogen or an alkyl group with 1-10 carbon atoms. As noted below, this representation of alkyl ligand R is similarly applicable to the other embodiments generally with $R^1R^2R^3CSn(X)_3$, with X corresponding to the trialkoxide or triamide moities. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CH_2CH_3$), sec-butyl ($R^1$ is methyl, $R^2$ is —$CH_2CH_3$, and $R^3$ is hydrogen), neopentyl ($R^1$ and $R^2$ are hydrogen, and $R^3$ is —$C(CH_3)_3$), cyclohexyl, cyclopentyl, cyclobutyl, and cyclopropyl. Examples of suitable cyclic groups include, for example, 1-adamantyl (—C($CH_2$)$_3$(CH)$_3$($CH_2$)$_3$ or tricyclo(3.3.1.13,7) decane bonded to the metal at a tertiary carbon) and 2-adamantyl (—CH($CH_2$)$_2$($CH_2$)$_4$($CH_2$)$_2$($CH_2$) or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. In summary, some examples of suitable alkyl groups bonded to tin include, for example, linear or branched alkyl (i-Pr (($CH_3$)$_2$CH—), t-Bu (($CH_3$)$_3$C—), Me ($CH_3$—), n-Bu ($CH_3CH_2CH_2CH_2$—)), cyclo-alkyl (cyclo-propyl, cyclo-butyl, cyclopentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups or combinations thereof.

While alkyl tin compositions are demonstrating particularly promising results other organometallic resist compositions have been explored. See, for example, U.S. Pat. No. 9,176,377 to Stowers et al., entitled "Patterned Inorganic Layers, Radiation Based Patterning Compositions and Corresponding Methods," published U.S. patent application 2013/0224652 to Bass et al., entitled "Metal Peroxo Compounds with Organic Co-ligands for Electron Beam, Deep UV, and Extreme UV Photoresist Applications," and published U.S. patent application 2002/0076495 to Maloney et al., entitled "Method of Making Electronic Materials," all of which are incorporated herein by reference. Other organometallic patterning compositions based on various metals are described in published U.S. Pat. No. 9,372,402B2 to Freedman et al., entitled "Molecular Organometallic Resists for EUV," incorporated herein by reference.

The coatings can be formed with precursors comprising $RSnX_3$, where X is a hydrolysable group, such as a halide, amide or alkoxide groups, although alkyl tin oxide hydroxide compositions can be directly deposited. The precursors can be deposited using a solution coating process or a vapor coating process. If these precursors have hydrolysable ligands, the deposition can be performed in the presence of water vapor to directly from an (organo) alkyl tin oxide hydroxide coating with hydrolysis occurring in situ.

Specifically, formation of photosensitive metal hydroxide oxide coatings can be achieved through various means known by those of ordinary skill in the art, such as spin coating. In some embodiments photosensitive organotin coatings can be formed via vapor deposition techniques, such as atomic layer deposition (ALD) or chemical vapor deposition (CVD) techniques, as described in Meyers et al. U.S. Pat. No. 10,228,618B2 entitled "Organotin Oxide Hydroxide Patterning Compositions, Precursors, and Patterning", and Marks et al. U.S. Pat. No. 9,778,561B2, respectively, and both of which are incorporated herein by reference.

If spin coating is used as a means to deposit the metal oxide hydroxide photoresist, then it is desirable to control the presence and concentration of reactive gases in the coat chamber. In the references above, it is disclosed that water vapor from ambient air may be needed to form a coating. The current invention further discloses the method of controlling the humidity within the coating chamber to a specific level in order to increase the reproducibility of the coating process and to optimize the uniformity of the coating. Additionally, the presence and concentration of other reactive gases or solvent vapors can be controlled to enhance coating reproducibility and/or coating uniformity.

After formation of the coating, the coated substrate typically undergoes a number of transfer steps within a wafer track or other instruments. During these transfer steps it is generally desirable to control the presence and concentration of reactive gases in order to reduce processing variability.

Generally, metal oxide hydroxide photoresists are stabilized by radiation sensitive ligands that decompose upon exposure to EUV, UV, or electron beams to create reactive metal sites (i.e., dangling bonds) within the material that can facilitate condensation and polymerization reactions, such as those described in reactions 1a, 1b, and 1c above, immediately following exposure or during subsequent processing steps, such as a post-exposure bake (PEB). Typically, for negative tone photoresists, the more condensed and polymerized a metal oxide the less soluble in developer, thus leading to contrast needed to operate as a photoresist.

The photoresist coatings can generally be patterned using radiation from suitable sources, such as extreme ultraviolet (EUV), ultraviolet (UV), or electron beam (EB) radiation. For fabrication of semiconductor devices, EUV radiation is generally preferable due to its higher resolution compared to UV radiation, and its higher throughput compared to EB radiation. Radiation can generally be directed to the substrate material through a mask or a radiation beam can be controllably scanned across the substrate to form a latent image within the resist coating.

Following exposure to radiation and the formation of a radiation patterned material with a latent image, it is generally desirable to perform a post-expose bake (PEB). In some embodiments, the PEB can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PEB temperatures and times within the explicit ranges above are contemplated and are within the present disclosure.

Owing to the nature of the metal oxide hydroxide material, it has been discovered that exposure to a reactive gas following radiation patterning can have much more impact on the material than if the reactive gas is introduced prior to radiation patterning. While not wanting to be limited by theory, it is believed that the radiation patterned material can be rapidly reacted with a reactive gas due to the presence of dangling bonds and unsatisfied coordination spheres, and reactive intermediates (e.g., metal hydrides) within the radiation patterned material. This effect can be illustrated by comparing the consequences of two different processing delays on the ultimate feature size seen after development of the radiation patterned coating, as shown in Example 2. Furthermore, exposure to a reactive gas to the radiation patterned material can facilitate radiolysis-induced thermolysis of other ligands within the material, and thereby further enhancing developer contrast.

It is therefore generally desirable for the radiation patterned metal oxide hydroxide photoresist to be exposed to a reactive gas during or subsequent to patterning with radiation and formation of a latent image. For example, following exposure to radiation and the formation of a latent image, a reactive gas can be present during the subsequent postexposure bake (PEB) process. The elevated temperatures of the PEB increase the rate of reaction between the reactive gas and the exposed regions of the photoresist.

After exposure of the radiation patterned material to a reactive gas, the material can then be developed in an appropriate developer solution. Useful developer compositions for these organotin oxide photoresists have been described in published U.S. Patent Application No. 2020/0326627 to Jiang et al., entitled "Organometallic Photoresist Developer Compositions and Processing Methods", incorporated here by reference. Owing to their compositions comprising both metal oxide hydroxide and organic ligands, it has been shown that both positive tone and negative tone patterning can be achieved in an organotin oxide hydroxide system. For example, when an organic solvent is used as a developer then negative tone patterning is realized wherein the unexposed material is dissolved away and the exposed material remains. In contrast, when an aqueous acid or base solution, for example comprising tetra alkyl ammonium hydroxide, is used as a developer then positive tone patterning can be realized wherein the exposed material is dissolved away and the unexposed material remains. When the current invention is practiced, it is possible to alter the solubility in a chosen developer relative to when the material remains unreacted with a reactive gas.

For the negative tone imaging, the developer can comprise an organic solvent, such as the solvents used to form the precursor solutions. In general, selection of appropriate developer solvent compositions can be influenced by solubility parameters with respect to the coating material, both irradiated and non-irradiated, as well as developer volatility, flammability, toxicity, viscosity, and potential chemical interactions with other process material. In particular, suitable developer solvents include, for example, aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, 1-propanol, methanol), ketones (e.g., methyl ethyl ketone, acetone, cyclohexanone, 2-heptanone, 2-octanone), ethers (e.g., tetrahydrofuran, dioxane, anisole) and the like. The development can be performed for about 5 seconds to about 30 minutes, in further embodiments from about 8 seconds to about minutes and in addition embodiments from about 10 seconds to about 10 minutes. A person of ordinary skill in the art will recognize that additional ranges within the explicit ranges above are contemplated and are within the present disclosure.

For positive tone imaging, the developer generally can comprise aqueous acids or bases. In some embodiments, aqueous bases can be used to obtain sharper images. To reduce contamination from the developer, it can be desirable to use a developer that does not have metal atoms. Thus, quaternary ammonium hydroxide compositions, such as tetraethylammonium hydroxide, tetrapropylammonium hydroxide, tetrabutylammonium hydroxide or combinations thereof, are desirable as developers. In general, the quaternary ammonium hydroxides of particular interest can be represented with the formula $R_4NOH$, where R=a methyl group, an ethyl group, a propyl group, a butyl group, or combinations thereof. The coating materials described herein generally can be developed with the same developer commonly used presently for polymer resists, specifically tetramethyl ammonium hydroxide (TMAH). Commercial TMAH is available at 2.38 weight percent, and this concentration can be used for the processing described herein. Furthermore, mixed quaternary tetra alkyl-ammonium hydroxides can be used. In general, the developer can comprise from about 0.5 to about 30 weight percent, in further embodiments from 30 about 1 to about 25 weight percent and in other embodiments from about 1.25 to about 20 weight percent tetra-alkylammonium hydroxide or similar quaternary ammonium hydroxides. A person of ordinary skill in the art will recognize that additional ranges of developer concentrations within the explicit ranges above are contemplated and are within the present disclosure.

Development may also be performed using a so-called dry process. Dry development can include, for example, selective removal of the irradiated or non-irradiated regions of the photoresist by exposing the material to an appropriate plasma or flowing gas. Dry development of organometallic resists has been described in PCT Publication No. 2020/132281 A1 by Volosskiy et al, entitled "Dry development of resists", incorporated herein by reference. In such dry development processes, development can be achieved by exposing the irradiated substrate to a plasma or a thermal process while flowing a gas comprising a Lewis acid, such as BCl3. In such processes, both negative tone and positive tone behavior can be achieved through appropriate selection of reactant gas.

Following development of the photoresist to form a patterned coating material, a subsequent anneal can be performed to further solidify and stabilize the patterned features. As with other processing steps, this anneal can be performed in an environment having specific reactive gases at specific concentrations. It may be desirable for reactive gases to be present at this anneal that were not present in previous steps. Since radiation patterning has already been performed, the photosensitivity of the material need not be retained and the material can instead be converted into a new composition to facilitate further processing, such as etch. For example, reductive reactive gases such as carbon monoxide, hydrogen gas, methane, and the like, and mixtures thereof, can be present during this anneal to convert at least a portion of the material to a new composition. A reactive gas present during this anneal step can enable subsequent etch steps or other processing by converting at least a portion of the patterned material to a new composition. In this way it is possible to enable post-processing techniques that can lessen or mitigate scumming, microbridging, or other defect by tailoring subsequent etch or other process steps to interact with the compositions formed by reacting the patterned material with a reactive gas.

Temperatures for this anneal are not particularly limited in so far as ancillary layers or materials can retain their respective properties, such as a sufficient etch contrast, and insofar the reactivity of the selected reactive gas or gases is sufficient. In some embodiments, the anneal can be between 100° C. and 500° C., in other embodiments from 200° ° C. to 500° C., and from 300° C. to 400° C. in further embodiments.

To help evaluate the development, wafers can be patterned to evaluate pattern formation as a function of EUV dose. To first order, imaging is considered a step function of regions of illumination and non-illuminated regions. The patterned structures can be evaluated using automated imaging equipment, and scanning electron microscope imagers are generally used. For example, specific commercial CD-SEM instruments can measure critical line dimensions (line widths) and can also evaluate defects, such as microbridging. In some embodiments, the improved processing described herein can result in an increase in critical dimension using the equivalent development, coating formation and irradiation. In some embodiments, the increase in critical dimension can be at least about 0.25 nm, in further embodiments at least about 0.50 nm, in further embodiments at least about 0.75 nm. A person of ordinary skill in the art will recognize that additional ranges of critical dimension increase within the explicit ranges above are contemplated and are within the present disclosure. Viewed another way, the concept of critical dimension can be expressed as a dose-to-size value, which is the radiation doze used to obtain a specific feature size. So an increase in critical dimension corresponds with a decrease in the dose-to-size value.

After forming a patterned coating material, the coating material can be further processed to facilitate formation of the selected devices. Furthermore, further material deposition, etching and/or patterning generally can be performed to complete structures. The coating material may or may not ultimately be removed. The quality of the patterned coating material can in any case be carried forward for the formation of improved devices, such as devices with smaller foot prints and the like. If the layer is not removed, the patterned coating (resist) material is incorporated into the structure. For embodiments in which the patterned coating (resist) material is incorporated into the structure, the properties of the coating (resist) material can be selected to provide for desired patterning properties as well as also for the properties of the material within the structure.

EXAMPLES

In each example below, the processing flow is generally similar for each example; however, each example differs in timing or atmosphere present. The organotin resist films in each example were prepared by spin coating an organotin solution of a 20/80 molar blend of MeSn(OtAm)$_3$ and tBuSn(OtAm)$_3$ in 4-methyl-2-pentanol onto a silicon wafer.

Example 1: Reactive Gas Concentration Effects on Processing

This example illustrates the effect that the concentration of a reactive gas, in this case carbon dioxide, can have on patterning performance of an organotin photoresist.
General Coating and Processing Steps Silicon wafers having a 10 nm layer of spin-on-glass (SOG) were used as the substrates. The wafers were coated with approximately 20 nm of organotin photoresist. The wafers were then baked at 100° C. for 60 s, exposed to EUV radiation on an ASML NXE3400 exposure tool at 47.1 mJ/cm$^2$, subsequently baked at 170° C. for 60 seconds, developed in 2-heptanone, and subject to a final bake at 150° C. for 60 seconds.
Processing with Reactive Gas Three wafers were each individually processed under atmospheres having differing levels of $CO_2$ ranging from a low of 354 ppm to a high of 506 ppm. The atmospheric components were constant throughout the processing for each individual wafer, except for during exposure, which was conducted under vacuum. Line and space patterns at a feature size of 18 nm on a 36 nm pitch were analyzed on a Hitachi CG5000 CD-SEM, which uses image analysis for the automated evaluation of critical dimension.

Figure 3:
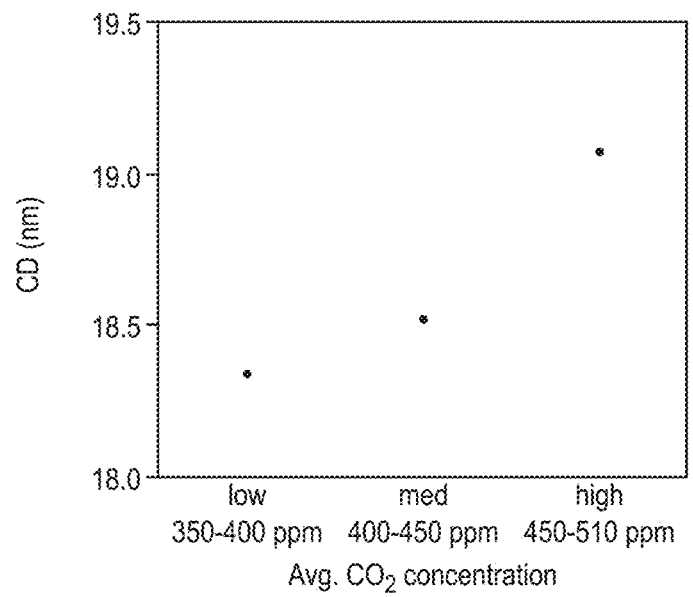
FIG. 3 is a plot of the critical dimension (CD) of a patterned film versus the average $CO_2$ concentration of the processing atmosphere.

FIG. 3 shows the difference in feature size, i.e., critical dimension (CD), at different concentrations of $CO_2$ during processing. Low concentrations of $CO_2$ from about 350 ppm to 400 ppm resulted in smaller CDs than wafers processed in the presence of higher levels of $CO_2$, and wafers processed in the presence of medium concentrations of $CO_2$ resulted in smaller CDs than wafers processed in the presence of an even higher concentration of $CO_2$. This example is illustrative for two reasons: 1) the presence of a reactive gas in sufficient concentration can lead to larger feature sizes for a given dose (i.e., the presence of a reactive gas in sufficient concentration can result in a lower processing dose for a desired feature size), and 2) it is desirable to control the concentration of a reactive gas within the processing atmosphere such that wafer to wafer repeatability is sufficient. Samples were processed with a constant dose of 47 mJ and constant process conditions. A larger CD obtained with a constant dose indicates that it would take a lower dose to achieve a particular desired result.

The results show an inverse relationship between $CO_2$ concentration during processing and the dose needed to image a given feature size. The change in CD was approximately 0.9 nm over an approximately 150 ppm increase in average $CO_2$ concentration. This result suggests that controlled increases in the concentration of a reactive gas, such as $CO_2$, in the processing environment can lead to improved patterning performance relative to standard processing.

Example 2: Effect of Processing Delays

This example illustrates the effect of controlled processing delays on the patterning performance of an organotin photoresist.

Figure 4:
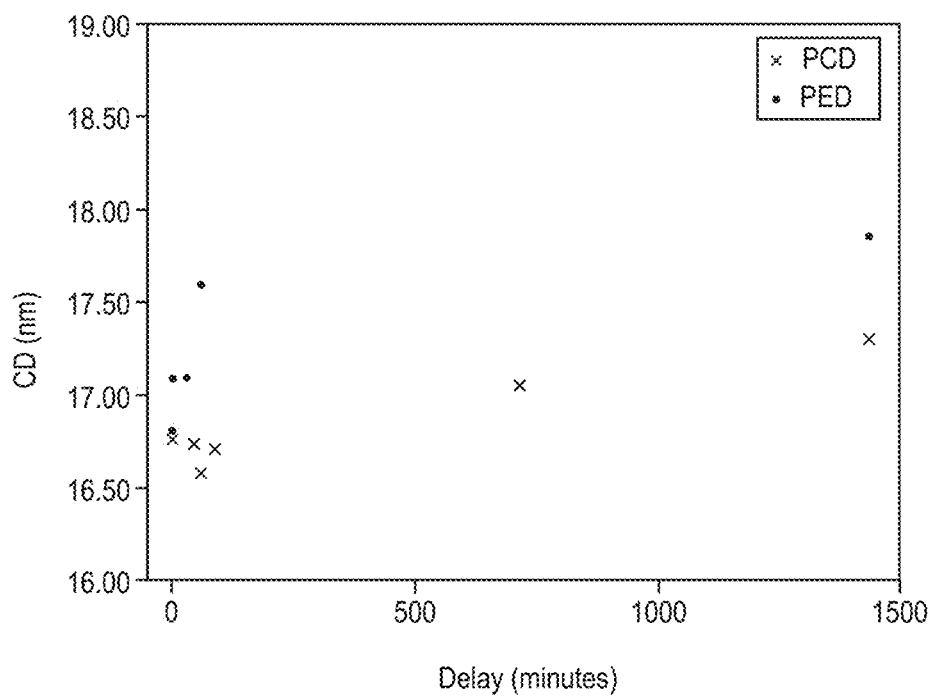
FIG. 4 is a plot of the critical dimension (CD) of a patterned film versus the delay time for a sample subject to a post-coat delay (PCD) and for a sample subject to a post-exposure delay (PED).

Two sets of wafers were coated and processed as described in the General Coating and Processing Steps in Example 1 with each set being subjected to delays at different points in the processing. One set of wafers was processed with a variable post-coat delay (PCD) wherein the substrate was coated, and then each wafer held in an ambient air atmosphere for a different amount of time, indicated as the delay. The post-coat delay (PCD) samples are shown in FIG. 4 with the "X" data labels. A second set of wafers was processed as normal through radiation patterning with EUV radiation, and then each wafer was processed with a variable post-exposure delay (PED) wherein each was held in ambient air atmosphere for a different amount of time (delay) prior to undergoing a post-exposure bake. The post-exposure delay (PED) samples are shown in FIG. 4 with the circular data labels. Both sets of wafers were ultimately developed, hard baked, and analyzed via similar means as described in Example 1.

From FIG. 4, it can be seen that wafers that underwent the PED delay experienced a greater shift in CD in much less time than wafers that underwent the PCD. As described in the specification above, the more rapid CD response to post-exposure delay is evidence of a higher reaction rate of the coated wafers, which may involve interactions between the radiation patterned material and the reactive gases in the ambient atmosphere, which may include nitrogen, oxygen, carbon dioxide, water vapor, for example. This result suggests that controlled delays in the presence of an appropriate processing environment can lead to improved patterning performance relative to standard processing, with this effect being more pronounced with a post-exposure delay than a post-coat delay.

Example 3: Ambient Atmosphere Effects During Exposure

This example illustrates the effect that a radiation exposure in a nitrogen atmosphere versus in an air atmosphere can have on patterning performance of an organotin photoresist.

Figure 5:
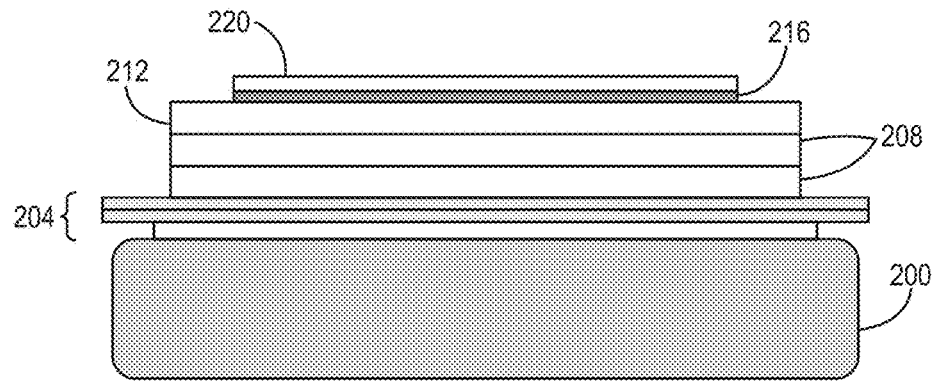
FIG. 5 is a schematic side view of an in-house UV exposure system.

Thin films for contrast curves were deposited on silicon wafers (150-mm diameter) having a native-oxide surface. A wafer stack was prepared by first depositing an approximately 60 nm bottom anti-reflection coating (BARC) (DUV46M, Brewer Science) by spin coating at 1300 rpm and then coating with approximately 20 nm of organotin photoresist, by spin coating the organotin solution at 1000 rpm. The wafers were then baked at 100° C. for 2 minutes. Exposure to 254 nm radiation was conducted by using a UVP UV Transilluminator operated at a laser power of 4.7 mW/cm², configured within an in-house UV exposure system, as shown in FIG. 5, for 3 minutes. FIG. 5 illustrates in-house UV exposure system 200 having UV source 202, which was a UVP UV Transilluminator, upon which is absorption material 204 which was a 0.03 mm film of polyethylene, upon which is fused silica diffuser plate 208, upon which is halftone mask 212. Halftone mask 212 contained a 10×10 array of variable transmissive pads that enable delivering a corresponding array of doses to the resist. Halftone mask 212 is separated from resist 216 by a small air gap of 0.28 mm. In the current example, substrate 220 was a silicon wafer. UV exposure system 200 was set up inside of a Cleatech isolation glove box equipped with an inlet for nitrogen gas, although processing with air is also enabled. To prepare the nitrogen atmosphere, the glove box was purged by flowing sufficient $N_2$ until the relative humidity inside was below 5%. The wafers were then loaded into the glovebox and the box was purged again until the relative humidity was stabilized below 5%. The second purge, with the wafers in the glovebox, was approximately 1 hour in duration. The wafers prepared for exposure in air were similarly delayed in an air atmosphere for a period of approximately 1 hour prior to exposure.

Following exposure, the wafers were baked at 170° C. for 2 minutes, developed in a 2-heptanone/acetic acid solution followed by a rinse with 2-heptanone/acetic acid, and then subjected to a final bake at 170° C. for 2 minutes.

Figure 6:
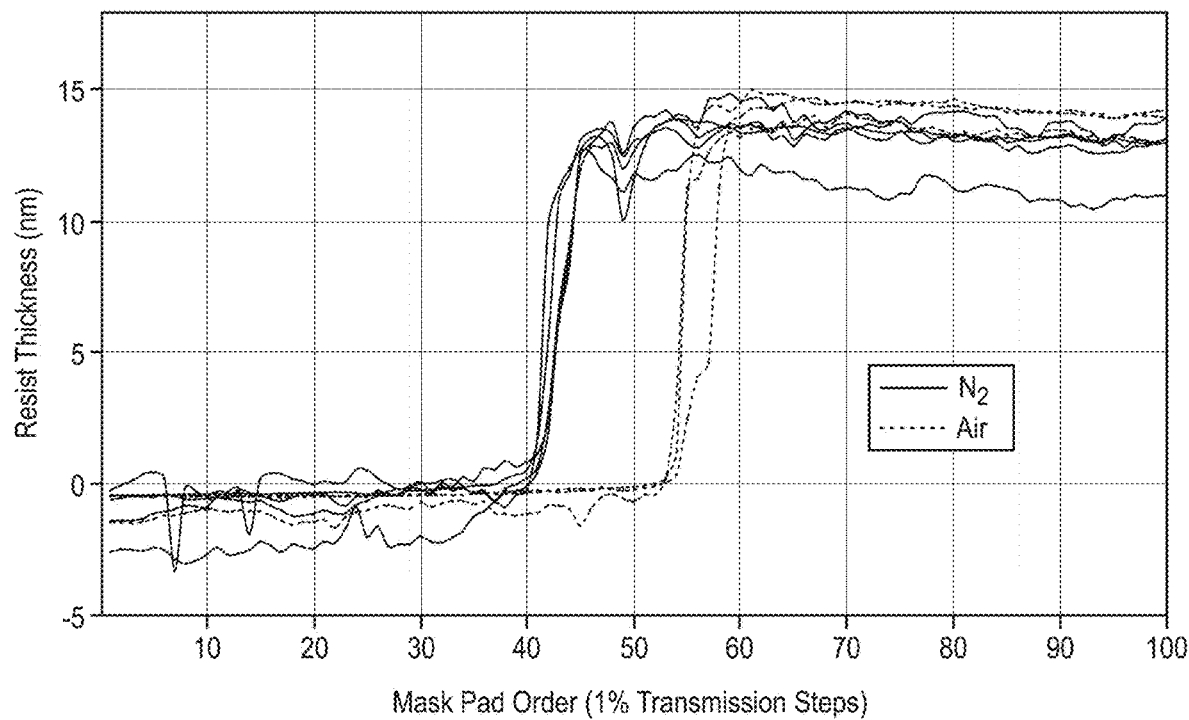
FIG. 6 is a plot of contrast curves with resist thickness as a function of pad number indicative of 1% dose steps for a set of replicate samples exposed in a nitrogen atmosphere and a set of replicate samples exposed in an air atmosphere.

A set of three wafers (A2, A3, A4) was exposed to the radiation in ambient air. A set of five wafers (A5-A9) was exposed to the radiation in the nitrogen atmosphere described above. The contrast curve data for the two sets of wafers is shown in FIG. 6. It can be seen that wafers that were exposed to the radiation in a nitrogen atmosphere showed contrast at a lower dose than the wafers that were exposed to the radiation in an air atmosphere. The results indicate an increase in resist sensitivity for resists exposed under ambient nitrogen relative to resists exposed under ambient air.

Example 4: Ambient Atmosphere Effects on Aging

This example illustrates the effect that a radiation exposure in a nitrogen atmosphere versus in an air atmosphere can have on patterning performance of an organotin photoresist after aging.

Thin films for contrast curves were deposited onto low-doped silicon wafers (150-mm diameter). Approximately 22 nm films of organotin photoresist were deposited onto the wafers. The wafers were then subjected to a post-application bake (PAB) at 100° C. for 2 minutes and exposed to 254 nm radiation for 3 minutes, as described in Example 3. The irradiated wafers were not subjected further processing, e.g., there was no post-exposure bake, development, or softbake.

As shown in Table 1, two wafers (F2 and F3) were coated in air, and then brought into the nitrogen-filled glove box, described in Example 3, and held prior to exposure for a selected delay period after the post-application bake (PAB) and then exposed to 254 nm radiation while in the nitrogen atmosphere having less than 5% RH. Two wafers (F4 and F5) were held in ambient air for a selected delay period after the PAB and then exposed to 254 nm radiation in ambient air. Each sample was analyzed with FTIR after a first delay period between radiation exposure and the FTIR analysis (t=1). Samples F2 and F4 were further analyzed with FTIR analysis after a second and a third delay period between radiation exposure the FTIR analysis, t=2 and t=3, respectively. All of the delays between radiation exposure and FTIR were performed in ambient air.

TABLE 1

| Wafer | Exposure Atmosphere | Delay between PAB and Exposure | Delay between Exposure and FTIR (t = 1) | Delay between Exposure and FTIR (t = 2) | Delay between Exposure and FTIR (t = 3) |
|---|---|---|---|---|---|
| F2 | $N_2$ | 75 min | 6 min | 80 min | 24 hours |
| F3 | $N_2$ | 117 min | 10 min | N/A | N/A |
| F4 | Air | 173 min | 8 min | 81 min | 24 hours |
| F5 | Air | 109 min | 9 min | N/A | N/A |

Figure 7:
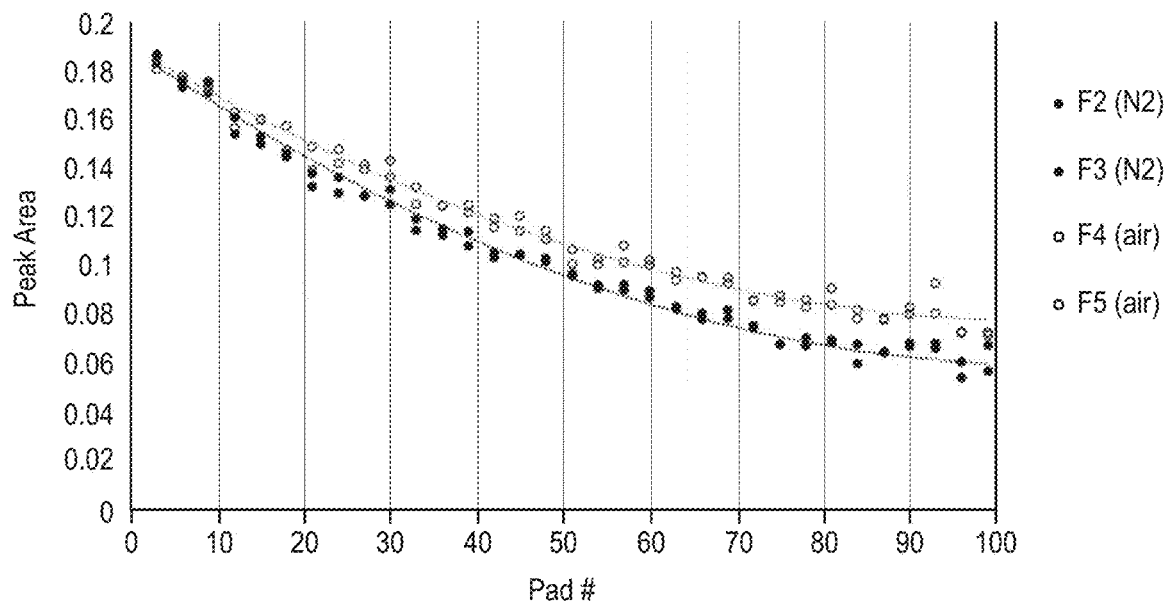
FIG. 7 is a plot the CH absorbance area from the FTIR spectra as a function of pad number with 1% dose steps for resist samples exposed to radiation in either a nitrogen atmosphere or in an air atmosphere, with the FTIR spectra measured after a first post-exposure aging period in air.

FIG. 7 shows the CH absorbance area measured from the FTIR spectra for each sample as a function of pad number after the t=1 delay. Dose increases with pad number. The results show that wafers that were exposed to the radiation in ambient air required a higher radiation dose to show the same reduction in CH area as the wafers that were exposed to the radiation in a nitrogen atmosphere. In other words, exposure in a nitrogen atmosphere resulted in a greater decrease in alkyl ligand signal than exposure in an air atmosphere. The variable delay period between the PAB and the exposure did not show a significant effect on the CH area measured. The results are consistent with the contrast curve results from Example 3, which showed the effect of a nitrogen atmosphere on the dose-to-gel. The results suggest an increase in resist sensitivity for resists exposed to radiation in a nitrogen atmosphere relative to resists exposed to radiation in ambient air. The increased sensitivity appears to be related to faster dealkylation of the exposed resist in nitrogen.

Figure 8:
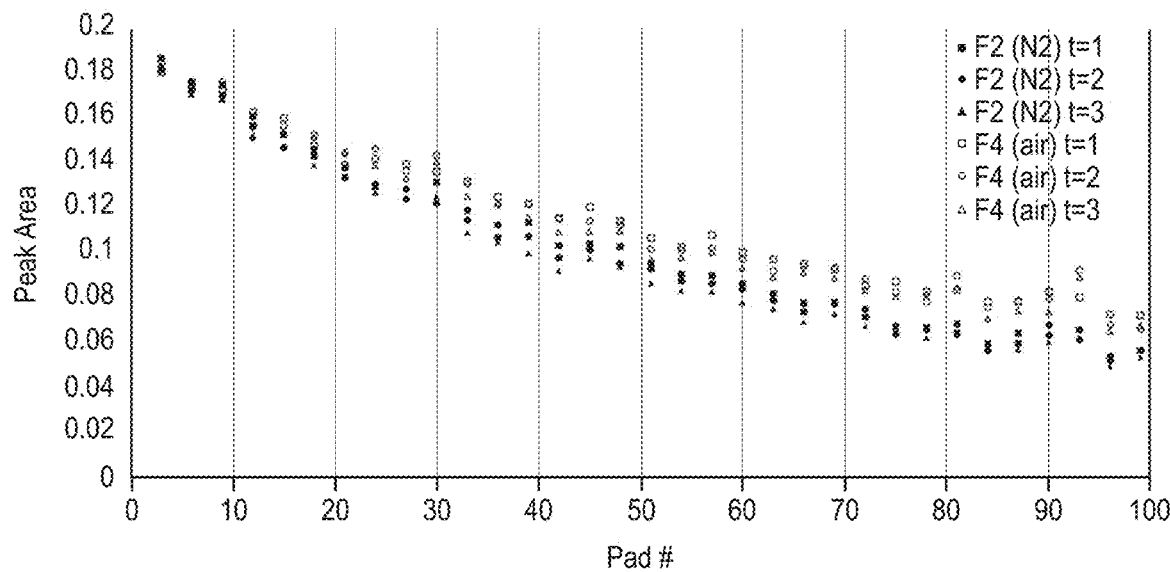
FIG. 8 is a plot of the CH absorbance area from the FTIR spectra as a function of pad number with 1% dose steps for resist samples exposed to radiation in either a nitrogen atmosphere or in an air atmosphere, with the FTIR spectra measured after a first, a second, and a third post-exposure aging period in air.

FIG. 8 shows the CH peak area measured from the FTIR spectra for samples F2 and F4 as a function of pad number and delay (aging) period between radiation exposure and FTIR analysis (t=1, t=2, or t=3). All samples were subjected to the post-exposure delay in air. The results show that the CH area for the both samples were further decreased after delays t=2 and t=3. For a given pad number, the F4 samples, exposed in ambient air, showed similar magnitudes of change in the CH area due to aging in air as the F2 samples, exposed under nitrogen. This shows that aging each sample in air resulted in a decrease in alkyl ligands. The results show the effect of the radiation atmosphere on the aging of the photoresist coatings and indicate that a more sensitive resist may result from radiation exposure in a nitrogen atmosphere.

Example 5: Ambient Atmosphere Effects after Radiation Exposure

This example illustrates the effect that a controlled delay in an air atmosphere versus in vacuum atmosphere can have on patterning performance of an organotin photoresist after EUV exposure.

Thin films for contrast curves were deposited on a set of silicon wafers having a native-oxide surface. Approximately 22 nm films of organotin photoresist coating were deposited onto the wafers. The wafers were then subjected to a post-application bake (PAB) at 100° C. for 60 seconds and then exposed to EUV radiation using a Energetiq Electrodeless Z-Pinch™ EUV Light Source EQ-10R. One wafer was subjected to a post-exposure delay (PED) of 24 hours in air, another wafer was subjected to a PED of 24 hours in vacuum, and another was processed without a PED. The samples were subsequently baked at 170° C. for 60 seconds and developed in 2-heptanone and subjected to a final bake at 250° C. for 60 seconds.

One wafer was subjected to a post-exposure delay by retaining the wafers for 24 hours in an ambient air atmosphere after the EUV exposure and before the subsequent bake. This sample is shown as the left most curve of FIG. 9 (24 hr PED in air). Another wafer was subjected to a post-exposure delay for 24 hours in a vacuum, and this sample is shown as the middle curve of FIG. 9 (24 hr PED in vacuum). Finally, one wafer was not subjected to a post-exposure delay. This sample is shown as the right most curve of FIG. 9 (No PED).

Figure 9:
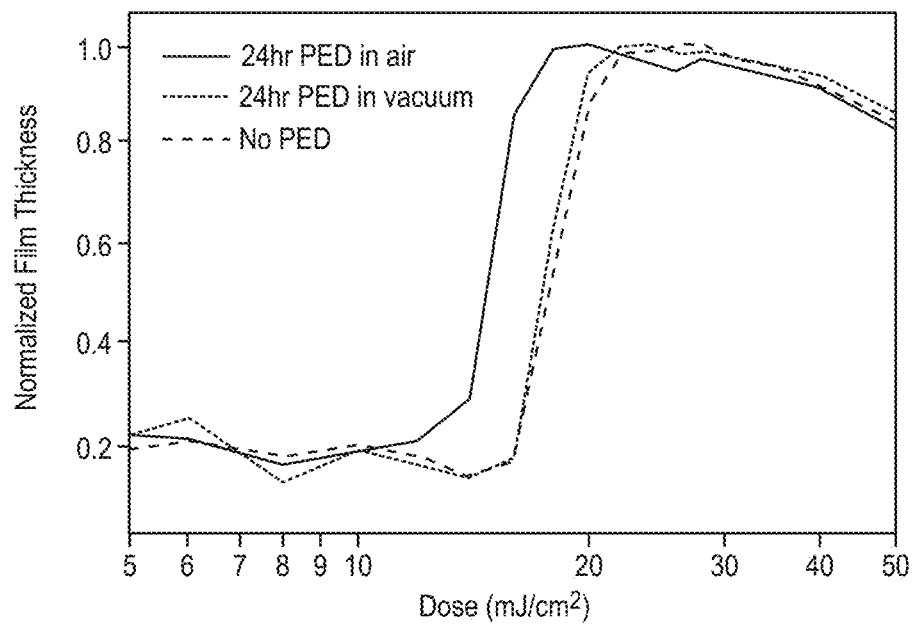
FIG. 9 is a plot with contrast curves showing normalized resist thickness as a function of exposure dose for EUV-irradiated resist samples subjected to either a 24 hour post-exposure delay in air, a 24 hour post-exposure delay in vacuum, or no post-exposure delay.

The contrast curve data of FIG. 9 shows that a post-exposure delay generally decreases the dose-to-gel. The results also show that the atmosphere in which the PED occurs further impacts the dose-to-gel. The wafers that were subjected to a post-exposure delay in air showed higher radiation sensitivity.

Figure 10:
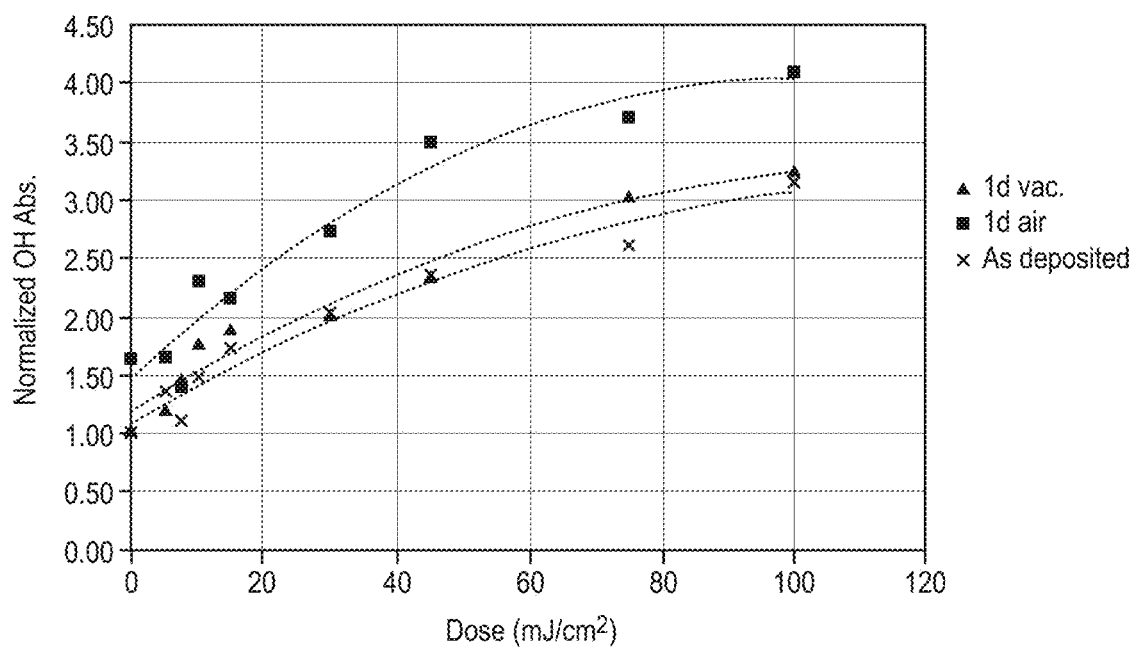
FIG. 10 is a plot of the normalized OH absorbance area as a function of exposure dose from the FTIR spectra of EUV-irradiated resist samples subjected to either a 24 hour post-exposure delay in air, a 24 hour post-exposure delay in vacuum, or no post-exposure delay.

FTIR analysis was also conducted on the wafers above, and the region centered around 3220 cm−1 corresponding to OH absorption was measured for each with the results presented in FIG. 10. The OH absorption is normalized with respect to the OH absorption for the as-deposited film, before exposure (dose=0). The data clearly shows that much more OH is present for the wafer subjected to a PED in air. The data shows a higher normalized OH absorbance before exposure for the samples held in air or vacuum for 1 day, indicating the presence of water absorbed during the delay. The data further shows that after a delay in air, the exposed material has an increased OH absorbance as compared to the sample held in vacuum or the sample without a delay. The data suggests that after a delay in air, the irradiated material is able to absorb relatively more $H_2O$ from ambient to form interstitial water and/or hydroxide ligands that lead to insolubility of the irradiated region, thereby lowering the dose needed to pattern the material, as shown in the contrast curves of FIG. 9

The results indicate that patterning a line with a desired CD can be achieved at a given dose in the absence of a delay in air or alternatively at a lower dose with a delay in air. In other words, a delay in air prior to exposure can result in a decrease in dose-to-size for a desired CD.

Example 6: Effects of Controlled Delays after Radiation Exposure

This example illustrates the effect that controlled delays in an air atmosphere after exposure can have on patterning performance of an organotin photoresist.

Thin films for contrast curves were deposited on a set of three silicon wafers (300-mm diameter) having a native-oxide surface. Approximately 22 nm films of organotin photoresist coating were deposited onto the wafers. The wafers were then subjected to a post-application bake (PAB) at 100° ° C. for 60 seconds and contrast curves were then exposed on an ASML NXE3400 exposure tool. Each of the three wafers was subject to a post-exposure protocol of delay and bake as shown in Table 2. Post-exposure delays were performed in air. The samples were subsequently developed in 2-heptanone.

TABLE 2

| Wafer | PED | PED Atmosphere | PEB temperature |
|---|---|---|---|
| a | 3 days | Air | No PEB |
| b | No PED | N/A | 160° C. |
| c | No PED | N/A | No PEB |

Figure 11:
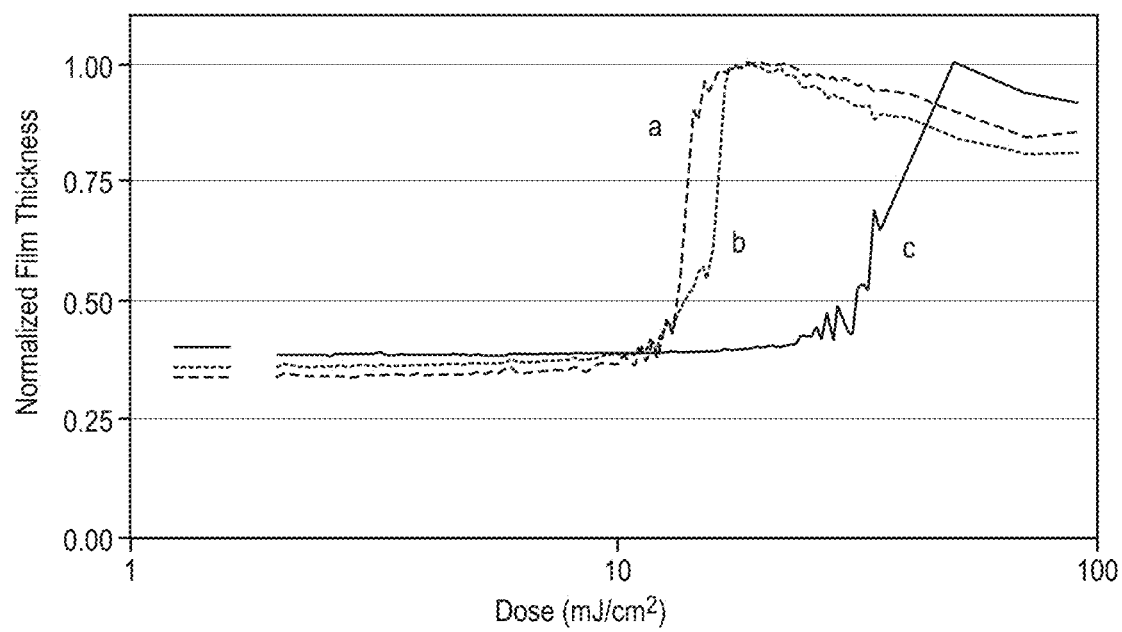
FIG. 11 is a plot of contrast curves showing normalized resist thickness as a function of exposure dose for resist samples subjected to three different combinations of post-exposure delay and post-exposure bake conditions.

FIG. 11 shows the contrast curves for wafers a-c. Comparing the dose-to-gel of Wafer c with that of Wafer a, shows that the dose-to-gel was lower for the sample with a PED, suggesting that significant reaction with atmospheric $H_2O$ and/or $CO_2$ has occurred to render the irradiated region more insoluble. Comparing the dose-to-gel of Wafer b with that of Wafer a, shows that the dose-to-gel was lower for the sample with a 3 day PED than for the sample with a PEB at 160° C. The results indicate that a delay after exposure may be used to increase resist speed and, in some cases, a post-exposure delay may be used to replace a post-exposure bake.

Further Inventive Concepts

1. A method for improving the processing of a radiation patternable organo tin-based coating comprising organo tin oxide hydroxide having Sn—C bonds, wherein the coating has a thickness from about 1 nm to about 500 nm, the method comprising:
   contacting the wafer with the organo tin oxide hydroxide coating, following irradiation, to an atmosphere comprising a reactive gas to alter the tin-bound ligands in the irradiated regions, wherein the reactive gas comprises $SO_2$, $H_2S$, $CH_3SH$, CO, COS, HOOH, $NH_3$, $H_2$, $O_3$, nitrogen oxide, $PH_3$, $SiH_4$, $CH_4$, ethylene oxide or a combination thereof.
2. The method of inventive concept 1 wherein the radiation patternable organo tin oxide hydroxide coating comprises a composition represented by the formula $RSnO_{(1.5-(x/2))}(OH)_x$ where $0<x\leq 3$,
   wherein R is an organic ligand with 1-31 carbon atoms, with a carbon atom bonded to Sn and with one or more carbon atoms optionally substituted with one or more heteroatom functional groups.
3. The method of inventive concept 1 wherein the contacting step is performed at a temperature from about 45° ° C. to about 250° C. after irradiating and prior to development
4. The method of inventive concept 1 wherein the contacting step is performed at a temperature of about 45° C. to about 150° C. for at least about 20 minutes.

5. The method of inventive concept 1 wherein the contacting step results in an increase in critical dimension in a developed structure of at least about 0.25 nm.
6. The method of inventive concept 1 wherein the atmosphere comprises reactive gas at a concentration from about 500 ppm by mole to about 5 mole percent and the pressure of the atmosphere is at least about 600 Torr.
7. The method of inventive concept 6 wherein the remaining atmosphere is air with a relative humidity from 40% to 60%.
8. The method of inventive concept 67 wherein the remaining atmosphere is nitrogen.
9. A method for improving the processing of radiation patternable organo tin-based coatings comprising organo tin oxide hydroxide having Sn—C bonds, wherein the coating has a thickness from about 1 nm to about 500 nm on a wafer, the method comprising:
   contacting the organo tin oxide hydroxide coating with an atmosphere comprising a reactive gas, wherein the reactive gas comprises $SO_2$, $H_2S$, $CH_3SH$, CO, COS, $H_2$, $O_3$, nitrogen oxide, $PH_3$, $SiH_4$, HOOH, $NH_3$, $CH_4$, or ethylene oxide and wherein the reactive gas differentially alters the tin-bound ligands in the irradiated and non-irradiated portions of the coating such that a latent image formed by exposure to radiation results in a greater contrast in development rate between the irradiated and non-irradiated portions of the coating.
10. The method of inventive concept 9 wherein the radiation patternable organo tin oxide hydroxide coating comprises a composition represented by the formula $RSnO_{(1.5-(x/2))}(OH)_x$ where $0 < x \leq 3$,
   wherein R is an organic ligand with 1-31 carbon atoms, with a carbon atom bonded to Sn and with one or more carbon atoms optionally substituted with one or more heteroatom functional groups.
11. The method of inventive concept 9 wherein the contacting step is performed at a temperature from about 45° ° C. to about 250° C. after irradiating and prior to development
12. The method of inventive concept 9 wherein the contacting step is performed at a temperature of about 45° C. to about 150° C. for at least about 20 minutes.
13. The method of inventive concept 9 wherein the contacting step results in an increase in critical dimension in a developed structure of at least about 0.25 nm.
14. The method of inventive concept 9 wherein the atmosphere comprises reactive gas at a concentration from about 500 ppm by mole to about 5 mole percent and the pressure of the atmosphere is at least about 600 Torr.
15. The method of inventive concept 14 wherein the remaining atmosphere is air with a relative humidity from 40% to 60%.
16. The method of inventive concept 14 wherein the remaining atmosphere is nitrogen.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated. The use of the term "about" herein refers to measurement error for the particular parameter unless explicitly indicated otherwise.

What is claimed is:
1. A method for improving the processing of a radiation patternable organo tin-based coating comprising organo tin oxide hydroxide having Sn—C bonds, wherein the organo tin oxide hydroxide coating has a thickness from about 1 nm to about 500 nm, the method comprising:
   contacting the wafer with the organo tin oxide hydroxide coating, following irradiation and development to form a developed pattern, to an atmosphere comprising a reactive gas to alter the tin-bound ligands in the developed pattern, wherein the reactive gas comprises $SO_2$, $H_2S$, an alkyl mercaptan, CO, COS, HOOH, $NH_3$, $H_2$, $O_3$, nitrogen oxide, $PH_3$, $SiH_4$, $Si_2H_6$, $CH_4$, ethylene oxide or a combination thereof, wherein the concentration of the reactive gas is greater than in ambient air.
2. The method of claim 1 wherein the developed pattern comprises a negative tone pattern.
3. The method of claim 1 wherein the organo tin oxide hydroxide coating comprises a composition represented by the formula $RSnO_{(1.5-(x/2))}(OH)_x$ where $0 < x \leq 3$,
   wherein R is an organic ligand with 1-31 carbon atoms, with a carbon atom bonded to Sn and with one or more carbon atoms optionally substituted with one or more heteroatom functional groups.
4. The method of claim 1 wherein the contacting step is performed at a temperature from about 100° C. to about 500° C.
5. The method of claim 1 wherein the contacting step is performed at a temperature of about 45° C. to about 150° C. for at least about 20 minutes.
6. The method of claim 1 wherein the contacting step results in an increase in critical dimension in a developed structure for a given exposure dose relative to a corresponding wafer not contacted with the reactive gas, wherein the exposure dose comprises EUV radiation.
7. The method of claim 1 wherein the contacting step results in an increase in critical dimension in a developed structure of at least about 0.25 nm.
8. The method of claim 1 wherein the atmosphere comprises reactive gas at a concentration from about 100 ppm by mole to about 10 mole percent.
9. The method of claim 1 wherein the atmosphere comprises reactive gas at a concentration from about 500 ppm by mole to about 5 mole percent and the pressure of the atmosphere is at least about 600 Torr.
10. The method of claim 1 wherein the pressure of the atmosphere is above atmospheric pressure.
11. The method of claim 1 wherein the pressure of the atmosphere is from about 800 Torr to about 1200 Torr.
12. The method of claim 8 wherein the remaining atmosphere is air with a relative humidity from 40% to 60%.
13. The method of claim 8 wherein the remaining atmosphere is an inert gas.

14. The method of claim 13 wherein the atmosphere further comprises water vapor at a concentration of no more than 10 ppm.

15. The method of claim 8 wherein the remaining atmosphere is nitrogen.

16. The method of claim 1 wherein the atmosphere has a relative humidity that varies by no more than about 10%.

17. The method of claim 1 wherein the reactive gas comprises $SO_2$, $H_2S$, $CH_3SH$, COS, $PH_3$, $SiH_4$, $Si_2H_6$, $CH_4$, ethylene oxide or a combination thereof.

18. The method of claim 1 further comprising, prior to contacting, irradiating the organo tin oxide hydroxide coating and developing the irradiated coating to form the developed pattern.

19. A method for improving the processing of a radiation patternable organo tin-based coating comprising organo tin oxide hydroxide having Sn—C bonds, wherein the organo tin oxide hydroxide coating has a thickness from about 1 nm to about 500 nm, the method comprising:
contacting the wafer with the organo tin oxide hydroxide coating, following irradiation, to an atmosphere comprising a reactive gas to alter the tin-bound ligands in the irradiated regions, wherein the reactive gas comprises $SO_2$, $H_2S$, an alkyl mercaptan, COS, $PH_3$, $SiH_4$, $Si_2H_6$, $CH_4$, ethylene oxide or a combination thereof.

20. The method of claim 19 wherein the reactive gas comprises $SO_2$, $H_2S$, $CH_3SH$, COS or a combination thereof.

21. The method of claim 19 wherein the contacting step is performed at a temperature from about 45° C. to about 250° C. after irradiating and prior to development.

22. The method of claim 19 wherein the contacting step is performed at a temperature less than about 100° C. after irradiating and prior to development.

23. A method for improving the processing of a radiation patternable organo tin-based coating comprising organo tin oxide hydroxide having Sn—C bonds, wherein the organo tin oxide hydroxide coating has a thickness from about 1 nm to about 500 nm, the method comprising:
contacting the wafer with the organo tin oxide hydroxide coating, following irradiation, to an atmosphere comprising a reactive gas to alter the tin-bound ligands in the irradiated regions, wherein the reactive gas comprises $SO_2$, $H_2S$, an alkyl mercaptan, CO, COS, HOOH, $H_2$, $O_3$, nitrogen oxide, $PH_3$, $SiH_4$, $Si_2H_6$, $CH_4$, ethylene oxide or a combination thereof, wherein the atmosphere comprises reactive gas at a concentration from about 100 ppm by mole to about 10 mole percent, wherein the concentration of the reactive gas is greater than in ambient air.

24. The method of claim 19 wherein the organo tin oxide hydroxide coating comprises a composition represented by the formula $RSnO_{(1.5-(x/2))}(OH)_x$ where $0<x\leq3$,
wherein R is an organic ligand with 1-31 carbon atoms, with a carbon atom bonded to Sn and with one or more carbon atoms optionally substituted with one or more heteroatom functional groups.

25. The method of claim 23 wherein the organo tin oxide hydroxide coating comprises a composition represented by the formula $RSnO_{(1.5-(x/2))}(OH)_x$ where $0<x\leq3$,
wherein R is an organic ligand with 1-31 carbon atoms, with a carbon atom bonded to Sn and with one or more carbon atoms optionally substituted with one or more heteroatom functional groups.

26. The method of claim 23 wherein the reactive gas comprises $SO_2$, $H_2S$, $CH_3SH$, COS or a combination thereof.

27. The method of claim 23 wherein the reactive gas further comprises $NH_3$.

28. The method of claim 23 wherein the contacting step is performed at a temperature from about 45° C. to about 250° C. after irradiating and prior to development.

29. The method of claim 23 wherein the contacting step is performed at a temperature less than about 100° C. after irradiating and prior to development.

30. The method of claim 23 wherein the atmosphere comprises reactive gas at a concentration from about 500 ppm by mole to about 5 mole percent and the pressure of the atmosphere is at least about 600 Torr.

\* \* \* \* \*